PROCESS OF FORMING SEMICONDUCTOR DEVICES BY MASKING AND DIFFUSION

Filed April 29, 1966

INVENTOR
Charles A. Wheeler

BY John D. [signature]

ATTORNEY 3,490,964

PROCESS OF FORMING SEMICONDUCTOR DEVICES BY MASKING AND DIFFUSION

Charles Alexander Wheeler, Dallas, Tex., assignor to Texas Instruments Incorporated, Dallas, Tex., a corporation of Delaware Filed Apr. 29, 1966, Ser. No. 546,438
Int. Cl. H01l 7/44, 7/36
U.S. Cl. 148—187 4 Claims

ABSTRACT OF THE DISCLOSURE

Disclosed is a method of fabricating a diffused junction transistor having high sheet resistance at the emitter-base interface and low sheet resistance at the base-base contact interface by diffusing a shallow region into a semiconductor body, forming an oxide with an opening exposing portions of the shallow region and heating the body to further diffuse the impurities and form the base region of the device.

Figures 1, 2, 3, 4, 5, 6:
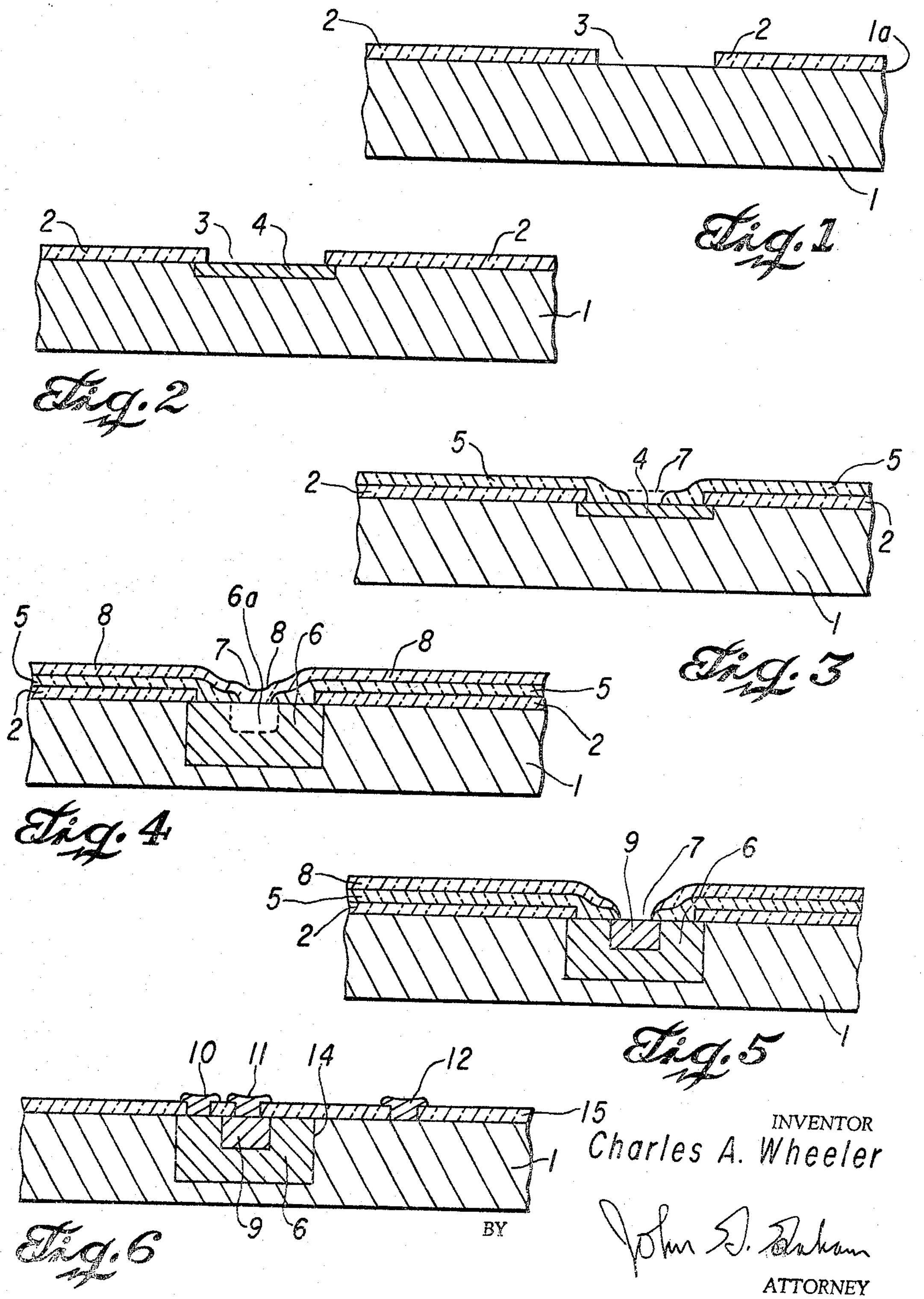

This invention pertains to diffused junction semiconductor devices, and more particularly to a process for fabricating diffused junction transistors having a high sheet resistance at the emitter-base interface and a low sheet resistance at the base-base contact interface.

Current developments in the microwave and switching circuit fields have resulted in increased demand for junction devices operating at higher frequencies and faster switching speeds. To achieve these objectives with diffused junction transistors, for example, the emitter transition capacitance $C_{TE}$ and the base transit time $1/W_B$ must be very small. These two parameters depend in turn upon the sheet resistance at the base side of the emitter-base junction being as high as possible. At the same time, however, it is desirable to have a very low sheet resistance over the remainder of the base region, particularly at the base-base contact interface, so that $r_{B'}$, the base resistance, can be kept small.

At present, the standard technique for fabricating an N-P-N silicon diffused planar transistor, for example, involves forming an oxide over a substrate of N-type silicon semiconductor material which forms the collector, removing a portion of this oxide where the base region is to be diffused, and diffusing a P-type impurity into the exposed portion of the collector substrate to form the base region, a thermally grown oxide layer being consequently formed during this diffusion step over the base region. However, during the base diffusion operation, the entire base surface is subjected to an impurity "gettering" caused in part by the consumption of the doped silicon during the thermal oxide growth, resulting in a significant increase in the sheet resistance across the entire base surface. Then, in order to provide the low sheet resistance at the points where the base contacts are to be made, it is necessary to perform an additional high concentration impurity diffusion to lower the sheet resistance at the point where the base contacts are to be made. Among the problems associated with this latter diffusion step is (1) an additional photo-masking step is required, (2) an additional high concentration diffusion step is required, (3) the method is not compatible with the various fabrication steps required in the fabrication of a monolithic integrated circuit.

It is therefore an object of the present invention to fabricate a diffused junction device capable of operating at high frequencies and achieving high switching speeds.

It is a more specific object to fabricate a diffused junction transistor by a process which results in a high sheet resistance at the base side of the emitter-base interface and a low sheet resistance at the base-base contact interface.

A more specific object of the invention is to fabricate an N-P-N silicon junction transistor utilizing a single base diffusion operation which results in the high sheet resistance at the base side of the emitter-base interface and the low sheet resistance at the base-base contact surface, and which does not require an additional P+ impurity deposition at the base-base contact interface.

The novel features believed characteristic of the invention are set forth in the appended claims. The invention itself, however, as well as other objects and advantages thereof may best be understood by reference to the following detailed description when read in conjunction with the accompanying drawings, wherein:

FIGURES 1–6 are sectional views of a portion of a semiconductor slice showing progressive steps in the fabrication of a transistor according to the process of the invention.

Referring now to FIGURE 1, there is depicted a semiconductor substrate 1, in this instance silicon, with a silicon oxide (dioxide) layer 2 thereupon. The substrate portion may be an undivided segment of a larger slice of monocrystalline silicon approximately one inch in diameter and possibly ten mils thick or an epitaxial layer upon said slice. This segment may then be subsequently divided into chips or wafers having a discrete P-N junction transistor formed therein, or may remain undivided, the transistor formed therein being just one component of an integrated network. The starting material of the substrate 1 may be of any conductivity type, but in accordance with the specific embodiment described herein, the material is N-type silicon semiconductor material.

The silicon dioxide layer 2 is provided on the surface 1*a* of the silicon substrate 1 by any conventional technique, for example, heating the silicon substrate to a temperature of approximately 1200° C. in the presence of steam for sufficient time to produce the layer 2 to a thickness of say 10,000 A. Thereafter, using conventional photographic masking and etching techniques, an aperture 3 is formed in the oxide layer 2, exposing a corresponding portion of the surface of the silicon substrate within the aperture.

As the next step in the process of the invention, a concentration of impurities is deposited on the surface and diffused into the substrate, to form a shallow surface layer 4 of the semiconductor substrate 1 within the window or aperture 3, as depicted in FIGURE 2. In this particular example, the P-type impurities are of boron which may be deposited by various techniques known in the art. One such technique, for example, involves the bubbling of nitrogen gas through a liquid solution of boron tribromide ($BBr_3$), the resultant vapor passing into a furnace maintained at from 850–1150° C., and then over the oxide-masked silicon slice located within an oxygen atmosphere within the furnace. During this operation, the boron impurities diffuse slightly into the substrate 1, as shown, to form the zone or concentration 4 of P-type impurities. A glaze that forms over the zone 4 is then removed by known techniques to give the resulting structure shown in FIGURE 2.

As the next step in the process of the invention, a silicon dioxide layer 5 is deposited upon the dioxide layer 2 and the impurity layer 4, as shown in FIGURE 3. Thereafter, using conventional photographic masking and etching techniques, for example, a portion of the dioxide layer 5 (designated by the dotted line) is removed to form the aperture or window 7. Thus a select portion of the impurity zone 4 within the surface of the substrate 1 is thereby exposed.

Various techniques may be utilized to deposit the silicon dioxide layer. It is desirable, however, that the technique utilized be carried out at sufficiently low temperatures to prevent any substantial diffusion of the impurity layer 4 any further into the silicon substrate 1, and additionally, to produce as dense an oxide layer as possible. For example, it may be desirable to use the "oxidative" technique, whereby oxygen is initially bubbled through liquid tetraethoxysilane at room temperature, the gaseous mixture being then combined with excess oxygen and passed into a furnace tube maintained at from 250–500° C. containing the structure shown in FIGURE 2, the silicon dioxide depositing as the layer 5. Other techniques for depositing the silicon dioxide layer 5 may be sputtering or electron beam evaporation.

The structure of FIGURE 3 is then placed within a conventional diffusion furnace to diffuse the boron impurities of the layer 4 deeper into the N-type collector. This diffusion is carried out in an oxidizing atmosphere so that a thermal oxide layer 8 (see FIGURE 4) is grown during this diffusion step, and is carried out at a temperature and for a time which results in the formation of the P-type base layer 6, whereby the sheet resistivity of the portion of this layer beneath the opening 7 (designated in FIGURE 4 as 6*a*) under the oxide layer 8 is substantially greater than the sheet resistivity of the portion of the region 6 beneath the oxide layer 5.

The mechanism for producing this variation in sheet resistivity across the base layer 6 is believed to be as follows: During the diffusion operation there is an "oxide gettering" effect whereby the impurities of the layer 4 are consumed by and remain within the thermally growing oxide layer 8 within the opening or aperture 7. At the lower diffusion temperatures, (900–1100° C.) this "gettering" rate is greater than the diffusion of the impurities into the body 1. However, since there has already been a slight diffusion of the boron impurities during the previously described deposition step, if the present diffusion operation is carried out for a very short period of time a portion of the impurities will diffuse into the semiconductor body 1 to form the layer 6 before the oxide gettering "overtakes" all of these impurities. This effect may also be described utilizing the following analogy: Assume that the amount of impurities that diffuse into the semiconductor body 1 beneath the opening 7 is represented by the formula $2T+C$ where T is the time for which the diffusion operation is carried out and C represents the amount of impurities that have already slightly diffused into the body 1 during the previous deposition step. Assume that the "oxide gettering" effect within the aperture 7 is represented by the formula 3T. It is therefore seen by comparing these formulas that although the gettering rate is higher than the diffusion rate at the outset of the diffusion and for a short time thereafter, there will be boron impurities diffusing into the collector portion 1 to form the base region 6 before the gettering effect predominates.

On the other hand, the gettering effect at the interface of the protective oxide layer 5 and the P-type doped surface area of the body 1 is significantly less than at the exposed portion of the surface in the aperture 7 (the gettering beneath the layer 5 being very little or possibly not at all). Thus the impurity concentration at the surface of the base region 6 is substantially greater directly beneath the oxide layer 5 than beneath the oxide 8 within the aperture 7, thereby resulting in a higher sheet resistivity of the portion 6*a* of the region 6 than the remaining portion of this region.

As the next step in the fabrication of the transistor, the thermally grown oxide layer 8 within the window 7 is removed, for example by dip etching, and an N-type impurity such as phosphorus, arsenic, or antimony, is diffused into the higher resistivity portion 6*a* to form the emitter region 9 (see FIGURE 5). As the final steps in the fabrication of the transistor, holes are cut in the oxide layers and a metal is evaporated over the slice or wafer and then selectively removed to form the emitter, base and collector contacts. If desired, the layers of oxide on the surface may be stripped off and a new layer 15, as shown in FIGURE 6, deposited upon the surface, and then the emitter contact 11, base contact 10, and collector contact 12 provided as shown. Since the surface area of the base layer 6 is highly doped, the base contact 10 makes low resistance contact at this point while there is a high resistance at the base side of the emitter-base interface or junction 14.

As previously pointed out, the purpose of the silicon dioxide film 5 is to eliminate or substantially reduce the gettering of the impurities except at the aperture 7. Experiments have indicated that there are two potential gettering effects at the interface of the oxide film 5 and the impurity zone 4. One is due to a slight inherent gettering of the oxide film 5 itself, and the second is due to an incomplete protection of the surface region beneath the oxide during the diffusion step. It has been observed, however, that by forming the oxide film 5 to a thickness of 6000 A. or greater, the latter gettering effect is substantially eliminated.

The final parameters of a transistor fabricated according to the process of the invention therefore depend in large upon the thickness and density of the silicon dioxide layer 5, the starting resistivity of the impurity zone 4 before diffusion and the time and temperature at which the diffusion is carried out. For one particular example, when the silicon dioxide layer 5 was formed by the "oxidative" technique to a thickness of 6000 A., the starting resistivity was at a value of 40 ohm/square, and the diffusion operation was carried out at 1050° C. for 16 minutes, the sheet resistivity of the layer 6 beneath the window 7 was approximately 120 ohm/square and the sheet resistivity of the remainder of the layer 6 was less than 60 ohm/square.

Although the process of the invention has been described with respect to the fabrication of a transistor, it is equally applicable to other P-N junction devices which require a high sheet resistivity at the P-N junction interface and a lower sheet resistivity at the contact surface area of one of the regions.

Various other modifications of the disclosed process may become apparent to persons skilled in the art without departing from the spirit and scope of the invention as defined by the appended claims.

What is claimed is:

1. A method for the fabrication of a transistor structure comprising:

forming a first selective diffusion mask on the surface of a silicon substrate of one conductivity type, said mask having an aperture therein defining the surface portion of a region of said substrate to be converted to the opposite conductivity type;

exposing said masked substrate surface to a first selected impurity, at diffusion conditions, for a time sufficient to convert a shallow surface layer of said substrate, defined by said mask aperture, to the opposite conductivity type;

depositing and patterning a second selective diffusion mask on the resulting composite structure, said second mask covering a first portion of said shallow surface layer of opposite conductivity type, and having therein an aperture defining a second portion of said shallow surface layer;

exposing the resulting composite structure to an oxidizing atmosphere, at a temperature sufficient to cause additional diffusion of the impurity in said shallow surface layer, and to selectively oxidize said second portion of the shallow surface layer, whereby said shallow surface layer is converted to a transistor base region of opposite conductivity type having a first sheet resistance directly beneath the aperture of said second selective diffusion mask, and a substantially lower sheet resistance beneath the remaining area of the aperture in said first selective diffusion mask;

diffusing a second selected impurity into the high sheet resistance portion of said base region, at diffusion conditions, to generate therein an emitter region of said one conductivity type; and forming ohmic contacts to the respective transistor regions of said structure, including an ohmic contact to said base region at a low sheet resistance surface portion thereof.

2. A method as defined in claim 1 wherein said first and second diffusion masks are comprised of silicon oxide.

3. A method for the fabrication of a semiconductor structure comprising:

forming a first selective masking layer on the surface of a semiconductor substrate of one conductivity type, said masking layer having an aperture therein defining a first surface portion of said substrate;

exposing the masked substrate surface to a selected impurity, at diffusion conditions, to convert a shallow surface layer of said substrate, defined by said aperture, to the opposite conductivity type;

depositing and patterning a second selective masking layer on the resulting composite structure, covering a first portion of said shallow surface layer of opposite conductivity type, said second masking layer having therein an aperture defining a second portion of said shallow surface layer;

heating the resutling composite structure to diffusion temperature in the absence of additional impurity for a time sufficient to cause aditional diffusion of the said impurity, whereby said shallow surface layer is converted to an enlarged region of said opposite conductivity type having a first sheet resistance directly beneath the aperture of said second selective masking layer, and a substantially lower sheet resistance beneath the remaining area of the aperture in said first selective masking layer.

4. A method as defined by claim 3 further including the steps of:

diffusing a second selected impurity into the high sheet resistance portion of said enlarged region of opposite conductivity type, to generate therein a diffused region of said one conductivity type; and forming ohmic contacts to said regions, including an ohmic contact to the low sheet resistance portion of said enlarged region.

References Cited

UNITED STATES PATENTS

| | | | |
|---|---|---|---|
| 2,419,237 | 4/1947 | Treuting | 148—191 |
| 2,462,218 | 2/1949 | Olsen | 148—191 |
| 2,873,222 | 2/1959 | Derick | 148—187 X |
| 3,298,880 | 1/1967 | Takagi | 148—191 |
| 3,309,245 | 3/1967 | Haenichen | 148—187 |
| 3,319,311 | 5/1967 | Mutter | 148—187 X |
| 3,345,222 | 10/1967 | Nomura | 148—187 X |
| 2,899,344 | 8/1959 | Atalla | 148—191 X |
| 2,948,642 | 8/1960 | MacDonald | 148—191 X |
| 3,193,419 | 7/1965 | White | 148—191 |
| 3,289,267 | 12/1966 | Ullrich | 148—187 X |
| 3,418,180 | 12/1968 | Ying Ku | 148—191 X |

HYLAND BIZOT, Primary Examiner

U.S. Cl. X.R.

148—191